(12) United States Patent
Yang et al.

(10) Patent No.: US 6,329,249 B1
(45) Date of Patent: Dec. 11, 2001

(54) METHOD FOR FABRICATING A SEMICONDUCTOR DEVICE HAVING DIFFERENT GATE OXIDE LAYERS

(75) Inventors: Won-Suk Yang, Seoul; Ki-Nam Kim, Ahnyang-shi; Jai-Hoon Sim, Kyunggi-do; Jae-Kyu Lee, Yongin-shi, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/333,574

(22) Filed: Jun. 15, 1999

(30) Foreign Application Priority Data

Jun. 15, 1998 (KR) ................................................ 98-22434

(51) Int. Cl.$^7$ .............................................. H01L 21/8234
(52) U.S. Cl. ............................ 438/275; 438/303; 438/239
(58) Field of Search .................................. 438/239, 241, 438/770, 981, 258, 275, 303

(56) References Cited

U.S. PATENT DOCUMENTS

| | | | |
|---|---|---|---|
| 4,352,236 | * 10/1982 | McCollum | 438/241 |
| 5,371,026 | 12/1994 | Hayden et al. | 437/41 |
| 5,595,922 | * 1/1997 | Tigelaar | 438/587 |
| 5,600,164 | 2/1997 | Ajika et al. | 257/321 |
| 5,756,385 | 5/1998 | Yuan et al. | 438/258 |
| 5,817,557 | * 10/1998 | Baldi | 438/264 |
| 5,841,174 | 11/1998 | Arai | 257/392 |
| 5,852,313 | * 12/1998 | Hong et al. | 257/326 |
| 5,960,289 | * 9/1999 | Tsui | 438/275 |
| 5,972,779 | * 10/1999 | Jang | 438/452 |
| 6,046,086 | * 4/2000 | Lin et al. | 438/264 |
| 6,136,657 | * 10/2000 | Yang et al. | 438/303 |
| 6,204,159 | * 3/2001 | Chang | 438/594 |

FOREIGN PATENT DOCUMENTS 0713249  5/1996  (EP) .

OTHER PUBLICATIONS

C.Y. Wong, et al., Sidewall Oxidation of PolycrystallineSilicon Gate, Sep. 1989, IEEE Electron Device Letters, vol. 10, No. 9, pp. 420–422.

* cited by examiner

Primary Examiner—John F. Niebling
Assistant Examiner—Stacy Whitmore
(74) Attorney, Agent, or Firm—The Law Offices of Eugene M. Lee, PLLC

(57) ABSTRACT

A method for fabricating a semiconductor device with different gate oxide layers. Oxidation is controlled in accordance with the active area dimension so that oxide grows thin at a wider active width (peripheral region) and grows thickly at a narrower active width (cell array region). A gate pattern is formed on a semiconductor substrate having different active areas. Gate spacers are formed and then active dimension dependent oxidation process is performed to grow the oxide layers differently from one another.

12 Claims, 11 Drawing Sheets

METHOD FOR FABRICATING A SEMICONDUCTOR DEVICE HAVING DIFFERENT GATE OXIDE LAYERS

BACKGROUND OF THE INVENTION

1. Field of the Invention

The present invention relates to a method of making a semiconductor device and, more particularly, to a method for forming different gate oxide layers in a single chip.

2. Description of Related Art

Recent trends toward high density integrated circuits increase the chip density while decreasing the size of the transistor built on the chip and decreasing gate oxide thickness.

FIG. 1 schematically shows the relationship between the electrical field (MV/cm) and the gate oxide thickness (Å) for a high voltage logic device and a normal voltage logic device. As can be seen, the probability of gate oxide breakdown increases with a decrease in gate oxide thickness. To avoid this problem, supply voltage ($V_{DD}$), which is required to operate the chip, has been reduced. Since a reduced supply voltage causes degradation of power and speed, the thickness of the gate oxide layer has to be reduced to cope with this degradation of power and speed.

It is well known that transistor characteristics can be increased by reducing the gate oxide thickness, while at the same time keeping the supply voltage at a constant level. On the other hand, the power consumption can be reduced by decreasing the supply voltage, while keeping the gate oxide thickness at a constant level. Therefore, the gate oxide thickness must be reduced without breakdown thereof, while keeping a constant electric field. This phenomenon is commonly referred to as the "constant electric field scaling law."

It is a recent trend in the DRAM or MDL industry to increase the chip areas occupied by the cell array. Therefore, if the gate oxide layers are formed to have the same thickness throughout the single chip, the gate oxide at the cell array region is subject to suffering from breakdown. Furthermore, since voltage ($V_{HDD}$) exceeding supply voltage ($V_{DD}$) is supplied to the cell array interior, the electric field applied thereto is increased, and this intensifies or increases the possibility of the gate oxide breakdown.

Since the cell density in the cell army region increases four folds per one generation, controlled threshold voltage is required against sub-threshold leakage and gate length variation, i.e., short channel effect margin is required. Besides short channel margin, drain saturation current ($I_{DSAT}$) is required to be increased in the peripheral region.

To overcome some of the above-mentioned problems, several methods have been disclosed. One of them is to increase the doping concentration in the channel region so as to adjust the threshold voltage considering the short channel effect. The increase in the doping concentration, however, decreases the breakdown margin and increases the threshold voltage variation for a given gate length. In other words, gate length margins are reduced.

Another approach is to fabricate the cell array region and peripheral region on different chips, and not on a single chip. This method, however, has a disadvantage of requiring process complexity and is not compatible with low-cost fabrication.

SUMMARY OF THE INVENTION

The present invention was made in view of the above problem provides a method for forming different gate oxide layers in a single chip and, more particularly, provides a method for forming different gate oxide layers after formation of the gate electrode. One of the key features of this invention is to form different gate oxide layers through the oxidation process, which is dependent on the dimension of the active width The active width dependent oxidation process is carried out after formation of the complete transistor (formation of the sidewall spacers).

Different dimensions of the active areas (for example, cell array region and peripheral region) are defined in and on the semiconductor substrate. A first thin gate oxide layer is formed on the overall active areas with the same thickness. Different gate patterns are then formed over the thin oxide layer of the active areas. The gate patterns cross the active areas in parallel with the width direction. In the narrow active region, (cell array region), gate patterns are formed to have a narrow distance between adjacent gate patterns while having a wide distance between adjacent gate patterns in the wide region (peripheral region). Gate spacers are formed on lateral edges of the patterned gates. Critical wet oxidation can be carried out to thereby grow the thin oxide layer in the narrow active region (cell array region). The wet oxidation allows gate oxide growth to a greater extent in the narrow active region than the wide active region (peripheral region). Thus, different gate oxide layers are formed in one chip, i.e., a relatively thick gate oxide layer is formed in the cell array region and a relatively thin gate oxide layer is formed in the peripheral region.

During the oxidation process, oxidation along the gate length does not occur very easily, while oxidants can easily diffuse through the gate with which overlaps the field oxide layer. Therefore, if the active width is narrow (in the cell array region), the oxidant from the gate width direction (i e., from the field oxide) grows thickly in the thin gate oxide layer. On the other hand, if the active width is wide (in the peripheral region), the amount of the oxidant from the gate width direction is small considering the active size, so that the thickness variation of the thin gate oxide layer is negligible. Accordingly, different gate oxide layers are formed in one chip.

BRIEF DESCRIPTION OF THE DRAWINGS

The invention may be understood and its objects will become apparent to those skilled in the art by reference to the accompanying drawings, wherein.

DETAILED DESCRIPTION OF THE PREFERRED EMBODIMENTS

Figure 1:
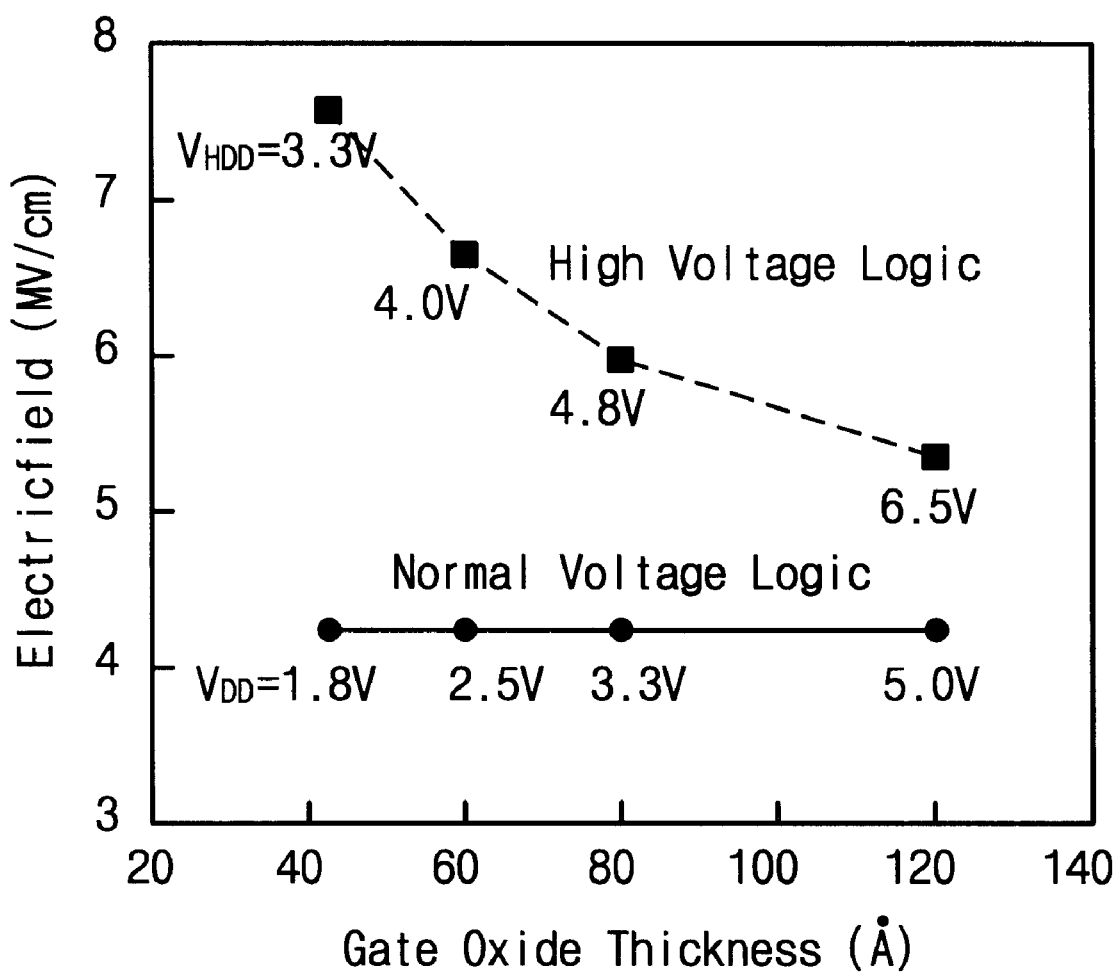
FIG. 1 schematically shows the relationship between electrical field (MV/cm) and gate oxide thickness (Å) with respect to a high voltage logic device and a normal voltage logic device.

Korean Application No. 98-22434, filed Jun. 15, 1998, is hereby incorporated by reference as if fully set forth herein. The preferred embodiments of the present invention will now be described with reference to the accompanying drawings. Like numerals in the drawings denote like embodiments. The present invention relates to a method for forming different gate oxide layers in a single chip using active dimension dependent oxygen diffisivity. The effective gate oxide layers are completely formed after completely forming the gate pattern.

Figure 2:
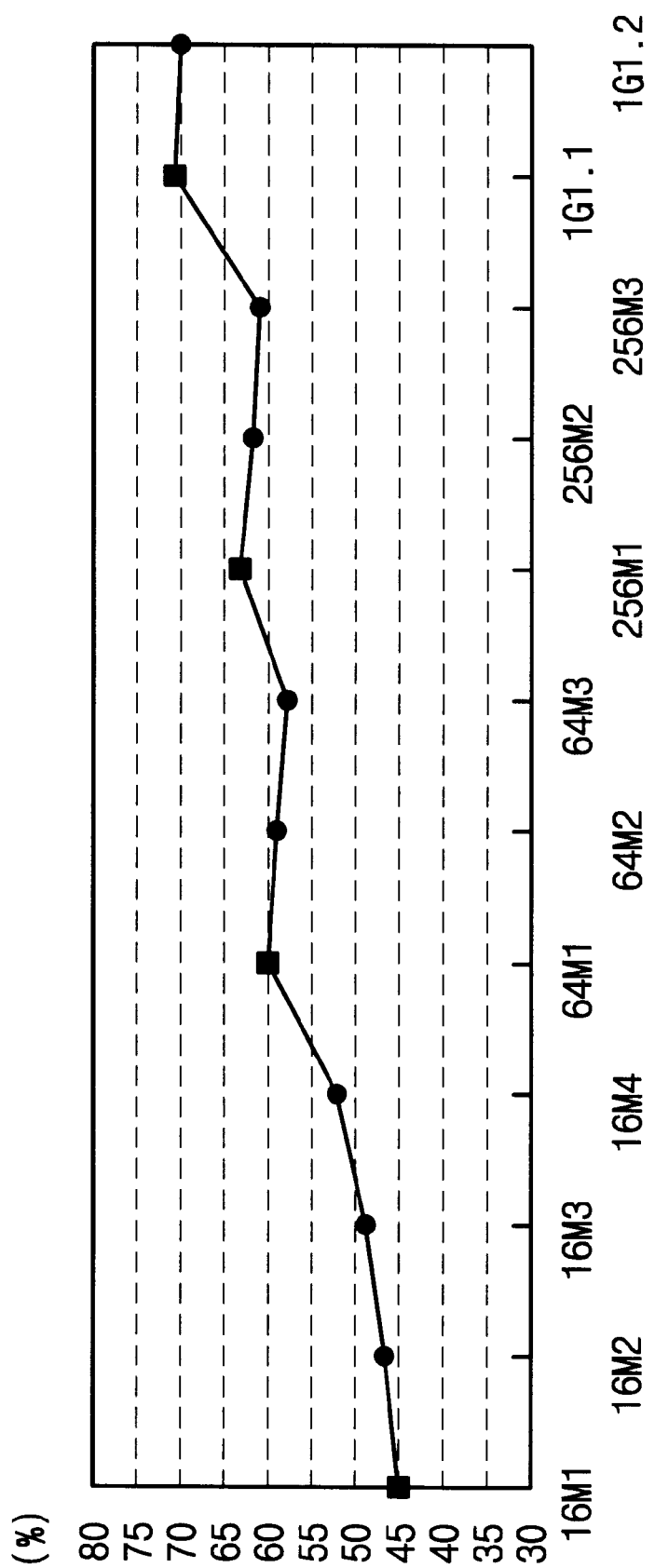
FIG. 2 shows the relationship between the degree of cell density and cell efficiency thereof.

FIG. 2 shows the relationship between the degree of cell density and the cell efficiency thereof. As can be seen, the degree of cell density is proportional to cell efficiency. As the cell density increases, the cell efficiency increases, too. This is because the cell density increases in the cell array region while the same circuit is used in the peripheral region. As the cell efficiency increases, gate oxide reliability arises easily in the cell array region due to a larger electrical field than in the peripheral region. Therefore, a device is needed that has different gate oxide layers, i.e., a thicker gate oxide in the cell array region and a thin gate oxide layer in the peripheral region.

The present invention provides on a single chip, both a high voltage device and a normal voltage device, whereby the threshold voltage difference between the high voltage device and the normal voltage device is more than 30%. To this end, the high voltage device has a thicker gate oxide than the normal voltage device, and the normal voltage device has a relatively thinner gate oxide than the high voltage device.

Figure 3A:
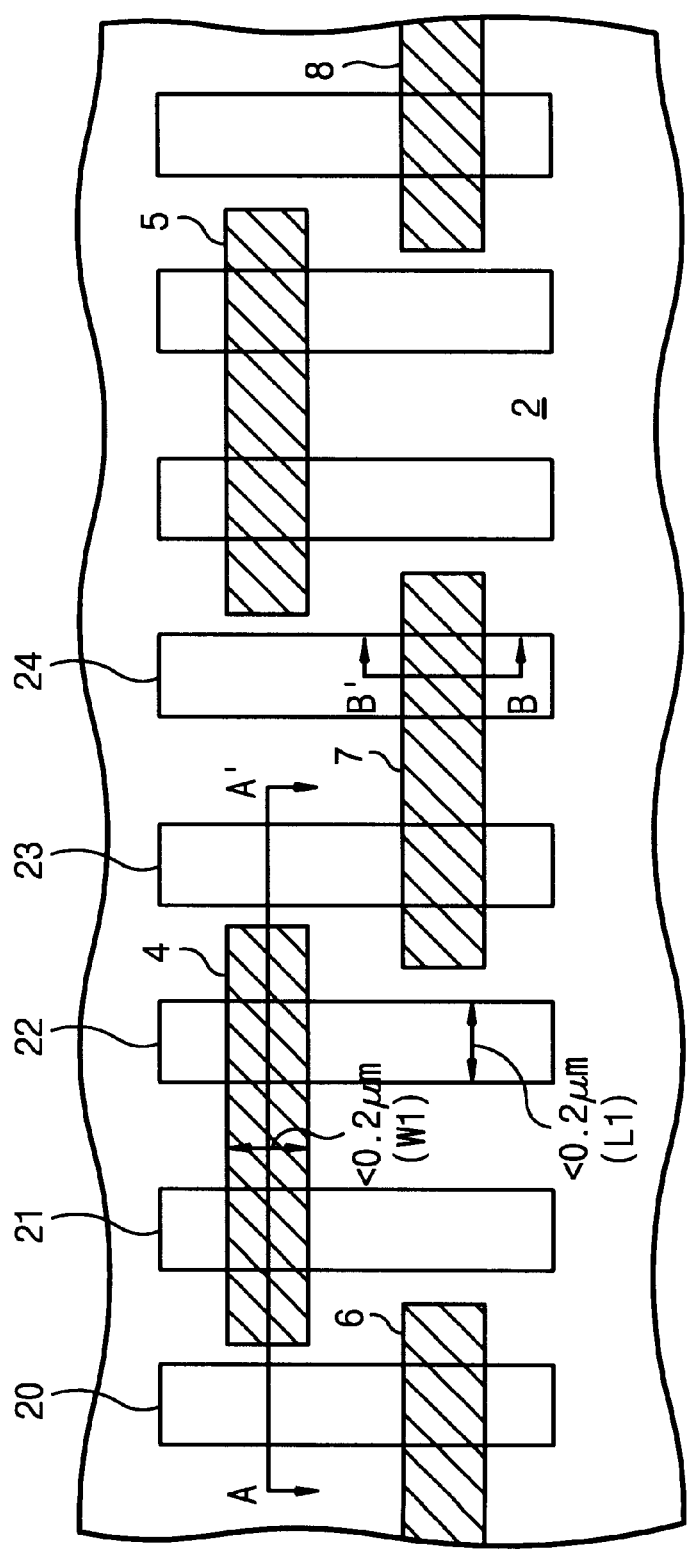
FIGS. 3A and 3B illustrate top plan views of a semiconductor substrate where a plurality of gate patterns are formed intersecting active areas surrounded by a field oxide layer and are, respectively, the cell array region and the peripheral region.
Figure 3B:
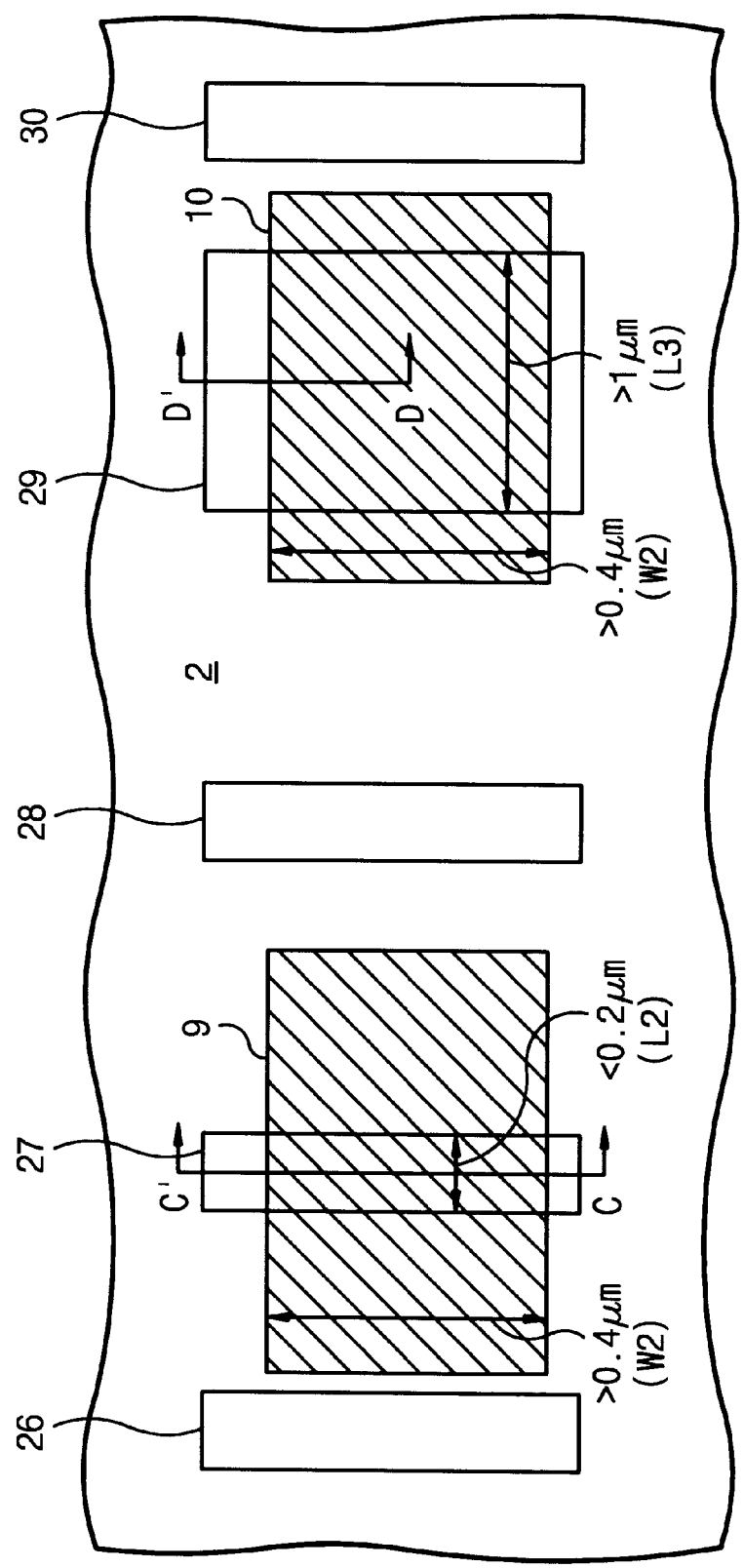

FIGS. 3A and 3B illustrate top plan views of a semiconductor substrate where a plurality of gate patterns are formed intersecting active areas surrounded by a field oxide layer and are, respectively, a cell array region (FIG. 3A) and a peripheral region (FIG. 3B).

Referring now to FIG. 3A, the gate patterns 20–24 intersect the active areas 4–8. Herein, the active width is indicated by reference number "W1" and the gate length is indicated by reference number "L1". As can be seen, in a preferred embodiment of the invention, the active width ("W1") in the cell array region is 0.2 micrometers or less, and the gate length ("L1") is 0.2 micrometers or less. Reference number 2 represents the field oxide layer which surrounds the active areas 4–8.

Referring now to FIG. 3B, active areas 9 and 10 are surrounded by the field oxide layer 2. The active areas 9 and 10 of the peripheral region have a wider active width ("W2") than that of the cell array region in FIG. 3A. A plurality of gate patterns 26–30 are formed running parallel with the active width direction. Herein, only one gate pattern intersects one active area. For example, the gate pattern 27 intersects the active area 9, and the gate pattern 29 intersects the active area 10. More than 90% of the active width ("W2") of the peripheral region is at least two times as large as the cell array region (0.2 micrometers), and most of the active areas are 1.0 micrometers in active width. The gate length of the gate patterns of the peripheral region is about 0.2 micrometers to 3.0 micrometers, and most of them are about 0.2 micrometers to 1.0 micrometers. For example, the gate pattern 27 has a gate length ("L2") of about 0.2 micrometers, and the gate pattern 29 has a gate length ("L3") of about 1.0 micrometers or more.

Figure 4A:
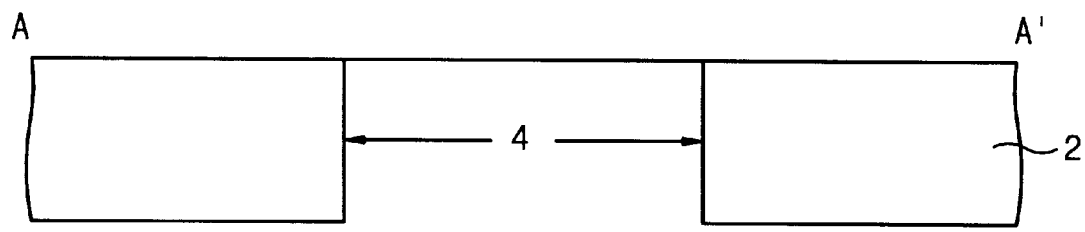
FIGS. 4A to 4B are cross-sectional views, respectively, taken along line A–A' and line B–B' of FIG. 3A before the formation of the gate pattern.
Figure 4B:
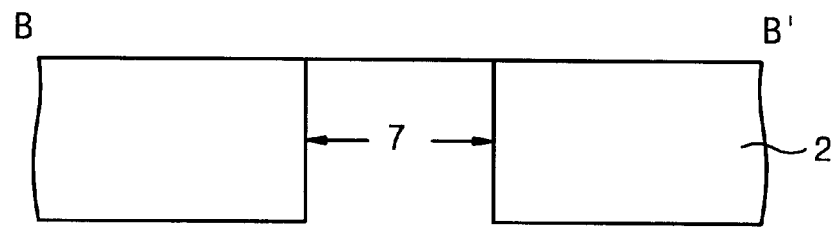
Figure 4C:
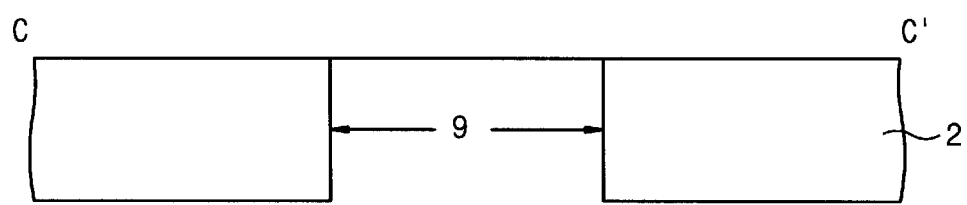
FIGS. 4C to 4D are cross-sectional views, respectively, taken along line C–C' and line D–D' of FIG. 3B before the formation of the gate pattern.
Figure 4D:
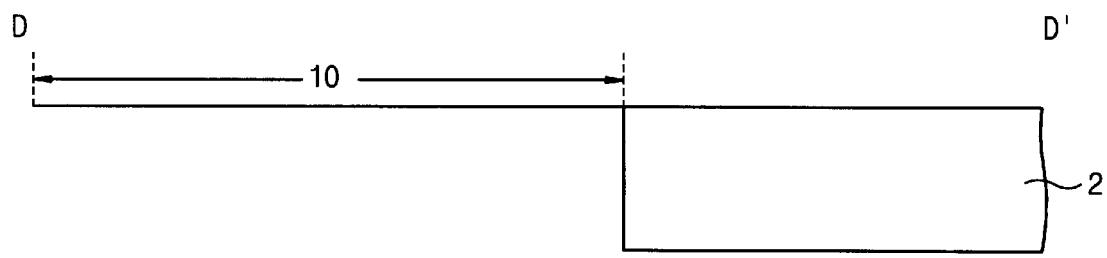
Figure 5A:
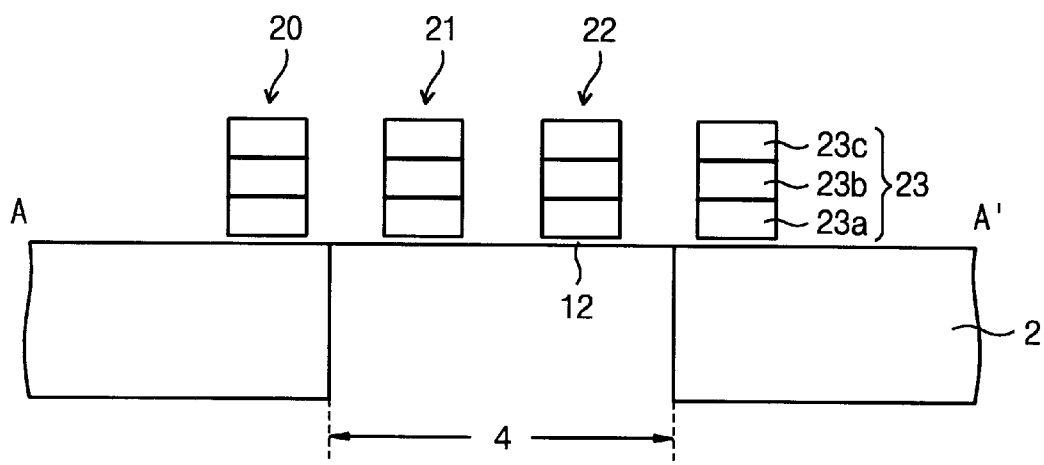
FIGS. 5A to 5D respectively illustrate a process step subsequent to that shown in FIGS. 4A to 4D wherein the gate pattern is formed.
Figure 5B:
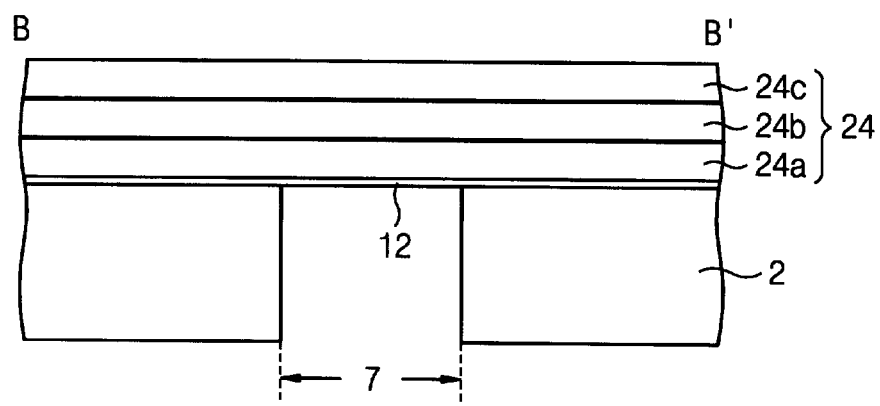
Figure 5C:
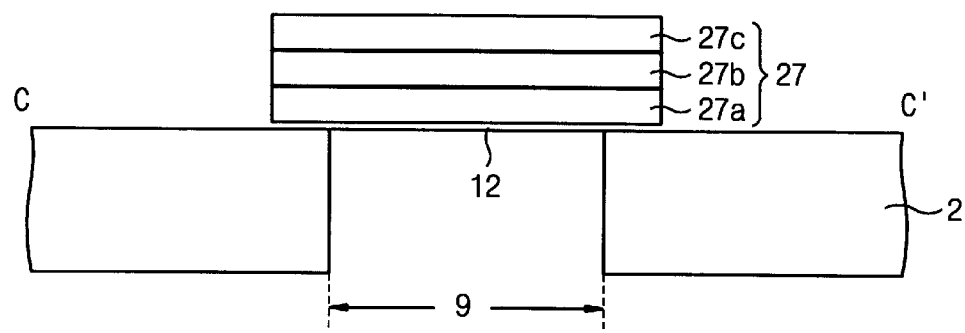
Figure 5D:
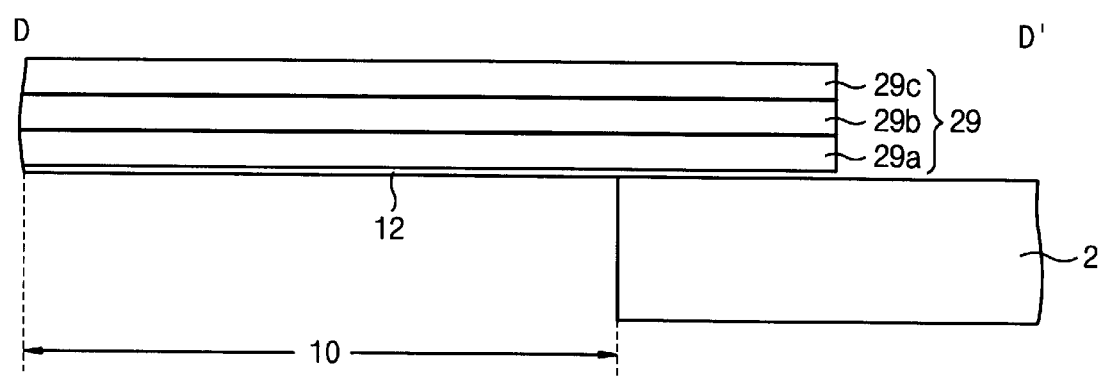

FIGS. 4A to 4B are cross-sectional views, respectively, taken along line A–A' and line B–B' of FIG. 3A before the formation of the gate pattern. FIGS. 4C to 4D are cross-sectional views, respectively, taken along line C–C' and line D–D' of FIG. 3B before the formation of the gate pattern.

Referring now to FIGS. 4A to 4D, the field oxide layer 2 is formed to define active areas 4 and 7 (cell array region, or high voltage region) and active areas 9 and 10 (peripheral region, or normal voltage region) on the semiconductor substrate (not shown). The active width ("W1", 7) of the cell array region (see FIG. 4B) is formed to be narrower than the active width ("W2", 9) of the peripheral region (see FIG. 4C). As described above, the active width ("W1") of the cell array region is about 0.2 micrometers or less and the active width ("W2") of the peripheral region is about 0.4 micrometers or more.

FIGS. 5A to 5D, respectively, illustrate a process step subsequent to that shown in FIGS. 4A to 4D wherein a gate pattern is formed. After defining the active areas, a conventional ion implanting process such as well ion implantation, field ion implantation, and channel ion implantation can be carried out. Skilled artisans are capable of carrying out such ion implanting processes using techniques known in the art. Thereafter, a first gate oxide layer 12 is formed over the entire semiconductor surface. The thickness of the first gate oxide is not affected by the dimension of the active areas. The gate oxide layer 12 is uniformly formed throughout the semiconductor surface. Stacked gate electrode patterns 20–24 (cell array region) and 27 and 29 (peripheral region) are formed. The gate patterns are formed by the process sequence of depositing the respective layers using known materials. Preferably, the gate patterns are formed by the process sequence of depositing doped polysilicon layers 23a, 24a, 27a, and 29a, silicide layers 23b, 24b, 27b, and 29b such as $WSi_x$, $TiSi_x$, and $MoSi_x$, hard mask layers 23c, 24c, 27c, and 29c such as $Si_3N_4$, HTO (high temperature oxide), PE-CVD (plasma enhanced chemical vapor deposition) oxide, and anti-reflection layer and then patterning to the desired configuration by a photo-etching process. Skilled artisans are capable of depositing the respective layers on the gate oxide layer using techniques known in the art. The hard mask serves as an etching mask, and as an ion implanting mask. The gate patterns 20–24 of the cell array region have a gate length ("L1") of about 0.2 microns or less. The gate patterns 27 and 29 of the peripheral region have a gate length of one and a half times as large as the cell array region, for example 0.2 micrometers to 3.0 micrometers, preferably most of them are 0.2 micrometers to 1.0 micrometers.

Anisotropic dry etching for gate patterning causes substrate damage and gate oxide encroachment at the bottom edges of the gate pattern. To cure the damage of the substrate and the gate oxide layer, a gate polyoxidation process can be carried out to form a second oxide layer (not shown) on the lateral edges of the gate patterns and on the surface of the semiconductor substrate outside of the gate patterns. At this time, a phenomenon known as "bird's beak" can occur in the bottom edges of the gate pattern so that the second oxide layer grows thickly. Electrical fields are concentrated at the bottom edges of the gate patterns due to the thicker oxide layer, thereby preventing degradation of the gate oxide.

FIGS. 6A to 6D, respectively, illustrate a process step subsequent to that shown in FIGS. 5A to 5D wherein gate spacers are formed and then oxidation is carried out. Referring now to FIGS. 6A to 6D, oxide spacers 30 are formed conventionally on the first oxide layer on lateral edges of the gate patterns 20–24, 27 and 29. These oxide spacers 30 serve the dual purpose as an oxidation barrier layer in the subsequent wet oxidation and as a self aligned mask for ion implantation.

Subsequently to forming the gate oxide spacers, critical wet oxidation is carried out to form a third oxide layer (not shown) at a temperature of about 750° C. to 850° C. Due to this wet oxidation, effective gate oxide thickness grows differently depending upon the active dimension (active width) and thereby forms different gate oxide layer in a single chip.

This wet oxidation allows for different oxide layer growth according to the dimension of the active width. Oxide layer grows thickly in the cell array region, while it grows very thin in the peripheral region. This is because, during this wet oxidation, oxidant difusivity from the thick field oxide layer (active width direction) greatly affects the oxidation process while the oxidant diffusivity from the gate oxide layer (gate length direction) is negligible in both the cell array region and the peripheral region. In other words, the oxidants from the gate length direction greatly affect the oxidation in the cell region with small active areas while minimally affecting the oxidation in the peripheral region with large active areas. Accordingly, oxide layer in the cell array region grows thickly in both the active width and the gate length directions due to its narrow active width. On the other hand, the oxide layer grows very thin in the peripheral areas due to its wide active width. Therefore, different gate oxide layers are formed in one single chip.

Figure 6A:
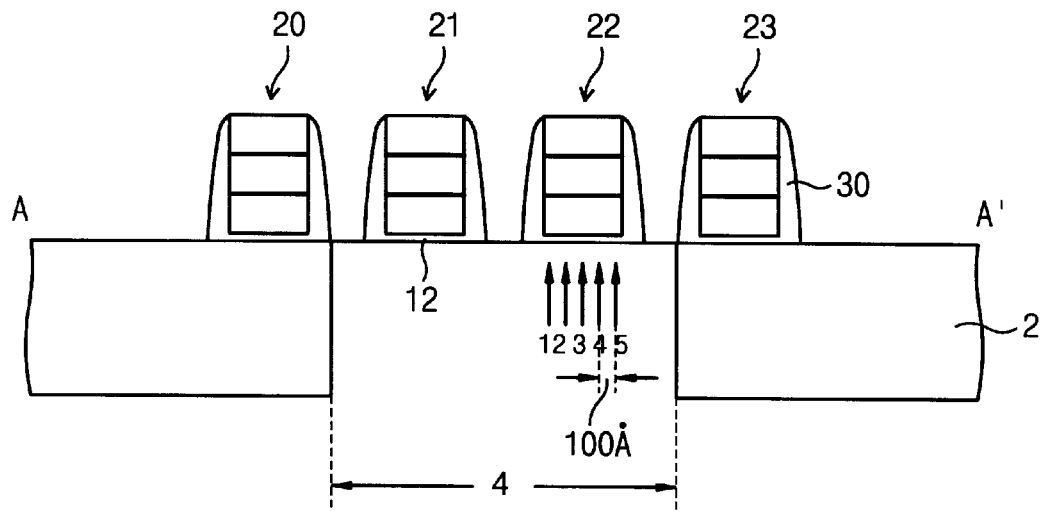
FIGS. 6A to 6D respectively illustrate a process step subsequent to that shown in FIG. 5A to 5D wherein gate spacers are formed, and then oxidation is carried out.
Figure 6B:
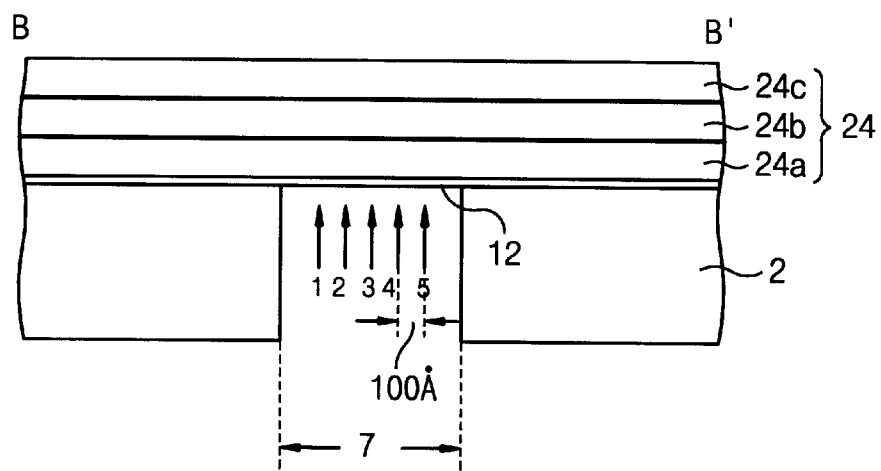

Referring to FIGS. 6A to 6D, there are provided five arrows (numbers 1 to 5) pointing out certain points of the gate oxide layer. In FIG. 6A, taken along the active length direction of the cell array region, the thickness of the portion of the gate oxide layer pointed to by the arrows 1 to 5 is 107 Å, 103 Å, 100 Å, 103 Å, and 107 Å, respectively. In FIG. 6B, taken along the active width direction of the cell array region, the thickness of the portion of the gate oxide layer pointed to by the arrows 1 to 5 is 110 Å, 105 Å, 100 Å, 105 Å, and 110 Å, respectively. In FIGS. 6A and 6B, the distance between each arrow and the next is 100 Å. The resulting gate oxide layer in the cell array region shown in FIGS. 6A ad 6B is grown thickly when compared to the thickness before wet oxidation.

Figure 6C:
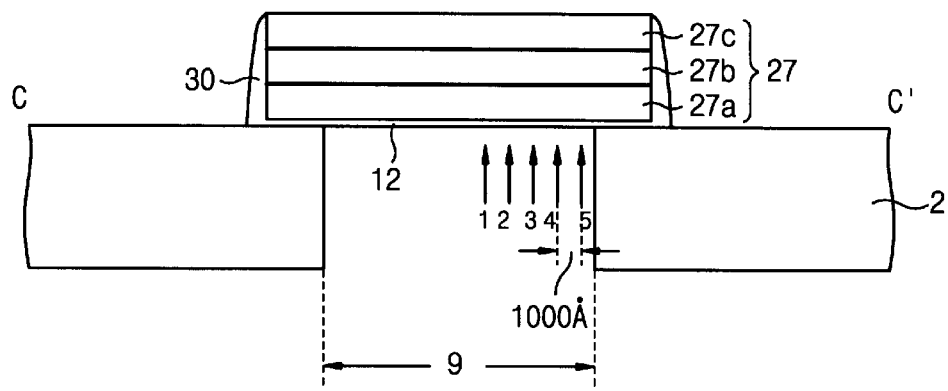
Figure 6D:
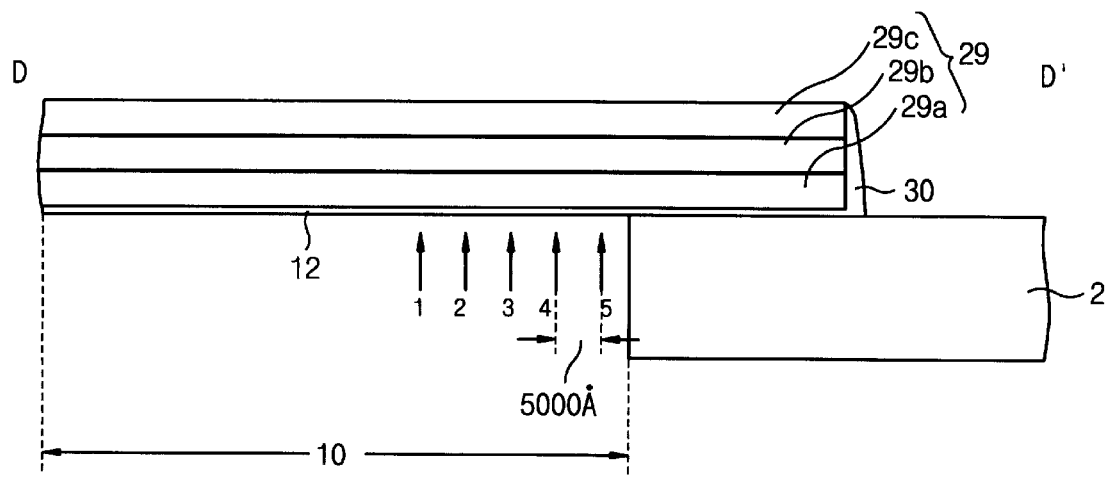

In FIG. 6C, taken along the active width direction of the peripheral region, the thickness of the portion of the gate oxide layer pointed to by the arrows 1 to 5 is 67 Å, 67 Å, 67 Å, 75 Å, and 107 Å, respectively. In FIG. 6D, taken along the active width direction of the peripheral region, the thickness of the portion of the gate oxide layer pointed to by the arrows 1 to 5 is 60 Å, 60 Å, 60 Å, 60 521, and 77 Å, respectively. In FIGS. 6C, the distance between each arrow and the next is 1000 Å, and in FIG. 6D, the distance between each arrow and the next is 1000 Å, respectively. In the peripheral region, the oxide layer grows thickly at the bottom edges of the gate electrode and oxide layer, except at the bottom edges, the thickness of the oxide layer is substantially the same thickness as the oxide layer before wet oxidation.

Figure 7:
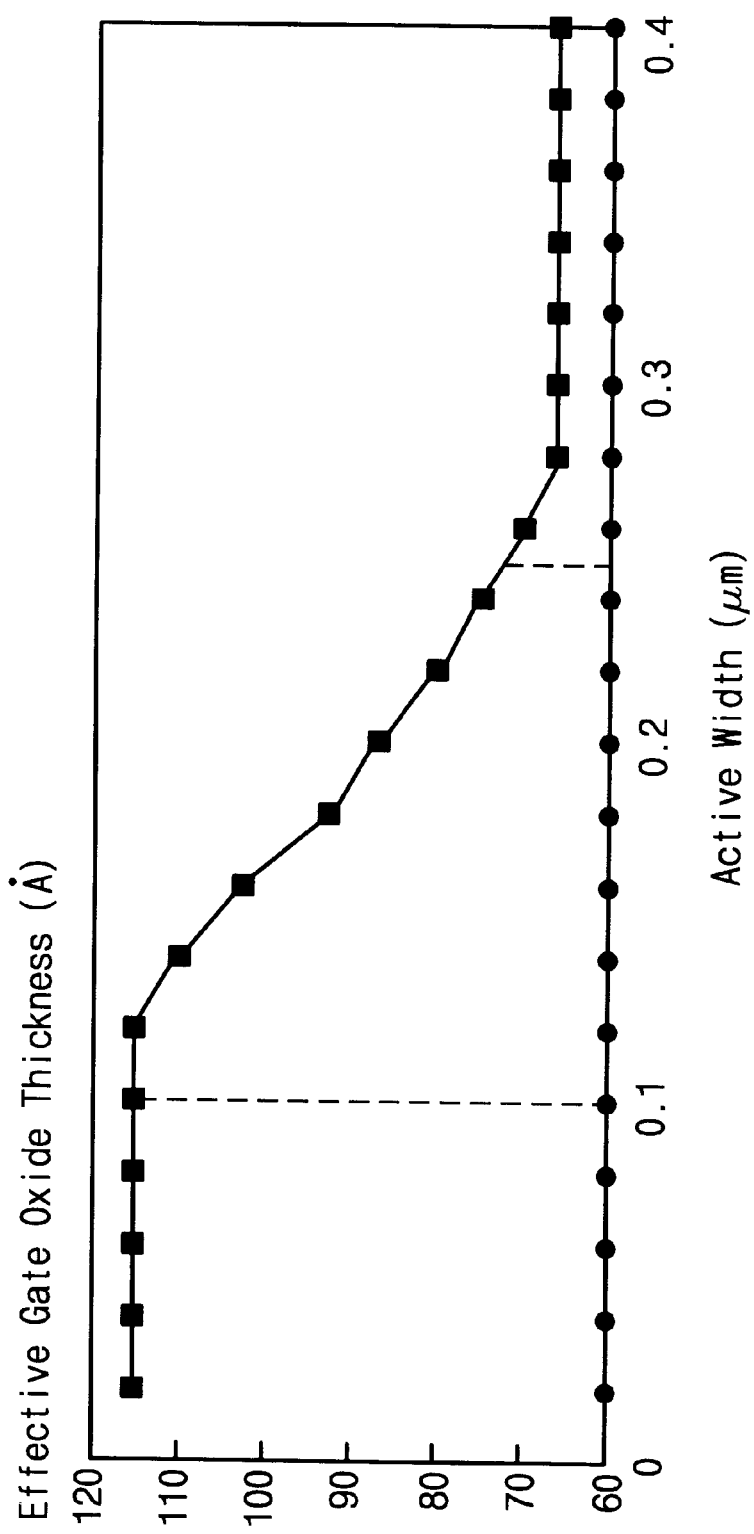
FIG. 7 shows the relationship between the thickness variation of the effective gate oxide and the active width under fixed gate pattern size (0.2 micrometers) by using the T-SUPREM4™ and MEDICI™ (procell & device simulator) manufactured by Avant

To better understand the current invention, FIG.7 is provided which shows the relationship between the thickness variation of the effective gate oxide and the active width under fixed gate pattern size (0.2 micrometers) by using the T-SUPREM4™ and MEDICI™ (procel & device simulator) manufactured by Avant. This simulation method was carried out under the condition that the gate pattern size is fixed at 0.2 micrometers and the wet oxidation is carried out on the bare wafer having 60 Å oxide layer at a temperature about 780° C. for 25 minutes in 10 liters $H_2O$ atmosphere.

As can be seen, if the active width is more than 0.25 micrometers, the thickness variation is about 7 Å due to the small size of the gate pattern. If the active width is in a range between 0.10 micrometers and 0.25 micrometers, the oxide thickness significantly increases due to the bird's beak phenomenon. If the active width is less than 0.1 micrometers, the bird's beak phenomenon becomes severe to cause bird's beak punch-through (oxidant punch-through) phenomenon. The thickness of the oxide layer increase from an initial thickness 60 Å to 115 Å. This bird's beak punch-through (oxidant punch-through) region can be adjusted (i.e., it can be shifted to a desired region) depending on the wet oxidation conditions. Skilled artisans are capable of adjusting the bird's beak punch-through region using the guidelines provided herein, and using techniques known in the art.

The following equations (oxidation mechanism) are provided to explain the bird's beak punch-through (oxidant punch-through) phenomenon. Herein, it is noted that the silicon surface has a concave contour.

Stress($\sigma_x$), at the silicon-silicon oxide interface is given by equation 1 below:

$$\sigma_x = \eta \xi (1/a^2 - 1/b^2) \quad \text{[equation 1]}$$

where $\eta$ is oxide viscosity, $\xi$ is the velocity constant determined by the oxide growth rate at the interface, and a and b represent the radius of curvature of the oxide layer as measured at an upper surface and at a lower surface (facing the silicon substrate), respectively.

The oxide bulk hydrostatic pressure (P) is given by equation 2 below:

$$P = \pm 2\eta \xi (1/b^2) \quad \text{[equation 2]}$$

The diffusivity constant (D) by stress is provided by equation 3 below:

$$D = D^*_0 \exp(-P^* V_0 / kT) \quad \text{[equation 3]}$$

wherein P is the bulk oxide stress, $D^*_0$ represents oxidant diffusivity at initial normal state; $P^*_0$ represents pressure of bulk oxide layer at normal state, and $V^*_0$ represents dependent oxidant asivity degree with respect to the pressure within the oxide layer.

The solubility (C*) is given by equation 4 below:

$$C = C^*_0 \exp(-P^* V_s / kT) \quad \text{[equation 4]}$$

wherein $C^*_0$ represents oxidant solubility at initial normal state, and $V_s$ represents oxidant solubility with respect to pressure.

The Surface reaction rate ($k_s$) is provided by equation 5 below:

$$k_s = K_0 \exp[\{-\sigma_x (\Omega_{SiO2} - \Omega_{si})\}/kT] \quad \text{[equation 5]}$$

where $\Omega_{SiO2}$ is molecular volume, $\Omega_{si}$ is atom volume, $k_0$ represents reaction rate at normal state, and x represents stress caused by oxide growth.

In equations 3–5, k represents Boltzmann's constant, and T represents absolute temperature (i.e., Kelvin temperature scale).

Since an oxide layer having a thickness of 60 Å is formed beneath the gate pattern along the gate length direction, stress is caused by a volume expansion during the oxidation process. Such stress allows significant reduction in oxidant diffusivity. Therefore, the increases in the oxide thickness is low. On the other hand, when a thick field oxide layer is formed beneath the gate pattern along the active width, the reduction of the oxidant diffusivity by volume expansion during oxidation process is very low. Therefore, the gate oxide layer grows thickly along the active width direction.

It is noted that in accordance with preferred embodiments of this invention, wet oxidation is performed after formation of the insulating spacers so as to intensify the influence of the active width on oxide growth during oxidation. Namely, the insulating spacers serves as at path for oxidation blocking.

Wet oxidation is preferably selected as oxidation ambient because wet oxidation has a high solubility (more than 600 times as high as dry oxidation), and water ($H_2O$) reacts with Si—O to form hydroxyl groups which break down the $SiO_2$ and thereby reduces the viscosity thereof. This reduces the above-mentioned bulk oxide stress and thereby increases the oxidation rate.

While this invention has been particularly shown and described with reference to the preferred embodiments thereof, it will be understood by those skilled in the art that various changes in form and details may be made without departing from the spirit and scope of this invention.

What is claimed is:

1. A method for forming at least two different gate oxide layers on a single chip, the method comprising:

forming at least two active areas on a semiconductor substrate, whereby the width of one active area is narrower than the width of a second active area;

forming a gate oxide layer on the semiconductor substrate including the active areas, wherein the gate oxide layer is grown by a wet oxidation process;

forming a gate pattern on the gate oxide layer at the active areas;

forming gate spacers on the sidewalls of each gate pattern; and growing the gate oxide layers, wherein the thickness of a gate oxide layer at an active area with a narrower active width is greater than the thickness of a gate oxide layer at an active area with a thicker active width.

2. The method according to claim 1, wherein the active area having a narrower width is used as a cell array region and an active area having a thicker width is used as a peripheral region.

3. The method according to claim 1, wherein the width of the active area having a narrower width is about 0.2 micrometers, and the width of the active area having a greater width is about 0.4 micrometers or more.

4. The method according to claim 1, wherein the length of the gate pattern on the active area having a wider active width is equal to or larger than the of length of the gate pattern on the active area having a narrower active width.

5. The method according to claim 1, wherein the length of the gate pattern on the active area having a wider active width is at least 1.5 times as large as the length of the gate pattern on the active area having a narrower active width.

6. The method according to claim 1, wherein the width of the active area having a narrower width is about 0.2 micrometers, and the width of the active area having a greater width is in the range of about 0.4 micrometers to 3.0 micrometers.

7. The method according to claim 1, wherein the gate spacers are comprised of an oxide layer.

8. The method according to claim 1, wherein the wet oxidation process is carried out at a temperature in the range of about 700° C. and 850° C.

9. The method according to claim 1, further comprising forming an oxide layer on the gate patterns and over the semiconductor substrate before the step of forming the gate spacers.

10. The method according to claim 9, wherein the oxide layer is grown thickly at lower and lateral edges of the gate patterns than the other portions so as to prevent an unacceptable electric field at the lower and lateral edges of the gate pattern.

11. The method according to claim 1, wherein the length of the gate pattern on the active area having a narrower active width is about 0.2 micrometers, and the length of the gate pattern on the active area having a wider active width is from about 0.2 to about 3.0 micrometers.

12. The method according to claim 1, wherein the gate pattern is parallel to the width of the active areas.

* * * * *